United States Patent [19]
Hikita et al.

[11] Patent Number: 6,046,506
[45] Date of Patent: Apr. 4, 2000

[54] SEMICONDUCTOR DEVICE WITH PACKAGE

[75] Inventors: Junichi Hikita; Kazutaka Shibata, both of Kyoto, Japan

[73] Assignee: Rohm Co., Ltd., Kyoto, Japan

[21] Appl. No.: 09/046,412

[22] Filed: Mar. 23, 1998

[30] Foreign Application Priority Data

Mar. 24, 1997 [JP] Japan ................................. 9-069324

[51] Int. Cl.⁷ ................................................. H01L 23/28
[52] U.S. Cl. ............................................ 257/787; 257/795
[58] Field of Search ................................. 257/790, 685, 257/686, 787, 795

[56] References Cited

U.S. PATENT DOCUMENTS

| | | | |
|---|---|---|---|
| 4,984,059 | 1/1991 | Kubota et al. | 257/787 |
| 5,278,451 | 1/1994 | Adachi et al. | 257/790 |
| 5,406,117 | 4/1995 | Diugokecki et al. | 257/790 |
| 5,543,664 | 8/1996 | Burns | 257/685 |
| 5,561,329 | 10/1996 | Mine et al. | 257/790 |
| 5,793,118 | 8/1998 | Nakajima | 257/790 |

*Primary Examiner*—Sheila V. Clark
*Attorney, Agent, or Firm*—Hoffmann & Baron, LLP

[57] ABSTRACT

A semiconductor device includes an IC chip. The IC chip is die-bonded on a mounting base, and encapsulated by a resin package. A flexible film such as a silicone resin film is interposed between the IC chip and the resin package. This flexible film serves to prevent the filler particles mixed in a synthetic resin as a resin package material from caving in a circuit element formed on the IC chip.

7 Claims, 2 Drawing Sheets

SEMICONDUCTOR DEVICE WITH PACKAGE

BACKGROUND OF THE INVENTION

1. Field of the Invention

This invention relates to packaged semiconductor devices. More particularly, this invention relates to a semiconductor device having semiconductor chips molded by a synthetic resin package in a state that they are interconnected with each other to enhance integration degree.

2. Description of the Prior Art

As well known, the semiconductor device generally has a semiconductor chip (IC chip) formed with circuit elements molded by a package of a thermosetting resin, such as an epoxy resin.

In a molding process for providing a package like this, a transfer-mold method is employed. The transfer-mold method involves the steps of placing a semiconductor chip in a hermetic state within a cavity of a metal mold, injecting a molten synthetic resin under high pressure into the cavity, and then cooling the synthetic resin down for curing.

In the transfer mold method, the package and/or semiconductor chip is acted upon by various stresses, involving the stress caused upon injecting a molten synthetic resin, the stress caused by contraction of synthetic resin upon solidification, and the stress caused by the difference in coefficient of thermal expansion of between the package and the semiconductor chip. Accordingly, there is a possibility that the package and the chip might suffer from damages. Besides this, there arises another problem. Specifically, the material for mold packages, i.e. a molten synthetic resin, is mixed with filler particles in order to increase its mechanical strength. The filler particles are strongly pressed on the semiconductor chip through the action of the stresses as stated above. Due to this, the filler particles are directly forced in the circuit element formed on the semiconductor chip, possibly resulting in damage to the circuit element.

It is noted that there is one method for reducing the stresses caused on a surface of the semiconductor chip due to hard filler particles contained in the package resin, as disclosed, e.g., in Japanese Laying-open Patent Publication No. H5-82679[H01L 23/29, 31] laid open to public on Apr. 2, 1993. This prior art includes process steps of covering a semiconductor chip with a polyimide resin, and thereafter molding a resin package thus formed. This prior art is effective to relieve the stresses caused by filler particles on the semiconductor chip surface, but raises a new further problem to be solved.

That is, where the surface of a semiconductor chip is covered by a polyimide resin as in Japanese Laying-open Patent Publication No. H5-82679, a resin layer after once formed has to be removed off at its bonding area by etching so as to expose the bonding area, as is shown in FIG. 3 of the same publication. That is, there is a disadvantage that this prior art involves complication in the process of manufacturing a semiconductor device.

SUMMARY OF THE INVENTION

Therefore, it is a principal object of this invention to provide a novel semiconductor device with a package.

It is another object of this invention to provide a semiconductor device which can be relieved of the stresses acting on the package and/or semiconductor chip by a simple process.

A semiconductor device according to this invention, comprises: a semiconductor chip; a package formed of a synthetic resin to encapsulate the semiconductor chip; and a flexible film interposed between the semiconductor chip and the package.

Where the semiconductor device includes one semiconductor chip, the flexible film is made in a size to cover at least an element-forming area on the semiconductor chip. However, where the semiconductor chip includes a first semiconductor chip and a second semiconductor chip stacked on the first semiconductor chip, the flexible film is made in a size covering at least one part of the second semiconductor chip and inserted between the second semiconductor chip and the package.

The stresses, as stated above, can be relaxed by the elastic deformation of the flexible film. It is therefore possible to prevent the package and/or semiconductor chip from being damaged. Further, since the flexible film serves to block the filler particles mixed in the synthetic resin from directly caving in the circuit element, the circuit elements on the semiconductor chip is positively prevented against injury. Further, the process is very simple as compared to the prior art, because it is satisfactory for the flexible film to adhere onto a required area on the semiconductor chip without the necessity of performing etching.

Note that, if the flexible film is mixed with a particulate matter, the circuit elements are prevented more effectively from being damaged by the filler particles. Specifically, the relaxation of the above-stated stresses requires to mere increase in elasticity of the flexible film. To achieve this, a material with higher flexibility may be selected as a material or the flexible film. However, if the flexible film is excessively elastic, there encounters reduction of effect of preventing the circuit element from being damaged by caving-in of the filler particles. Where a particulate matter is mixed in the flexible film, when the package filler particles are forced in the flexible film, the particulate matters at the neighborhood move in a closely related manner. This makes it possible to prevent the filler particles from further caving in. Therefore, the mixing of a particulate matter in the flexible film can satisfy contradictory requirements of relaxing stresses and blocking the filler particles from caving in the circuit element.

The above described objects and other objects, features, aspects and advantage of the present invention will become more apparent from the following detailed description of the present invention when taken in conjunction with the accompanying drawings.

DETAILED DESCRIPTION OF THE PREFERRED EMBODIMENT

Figure 1:
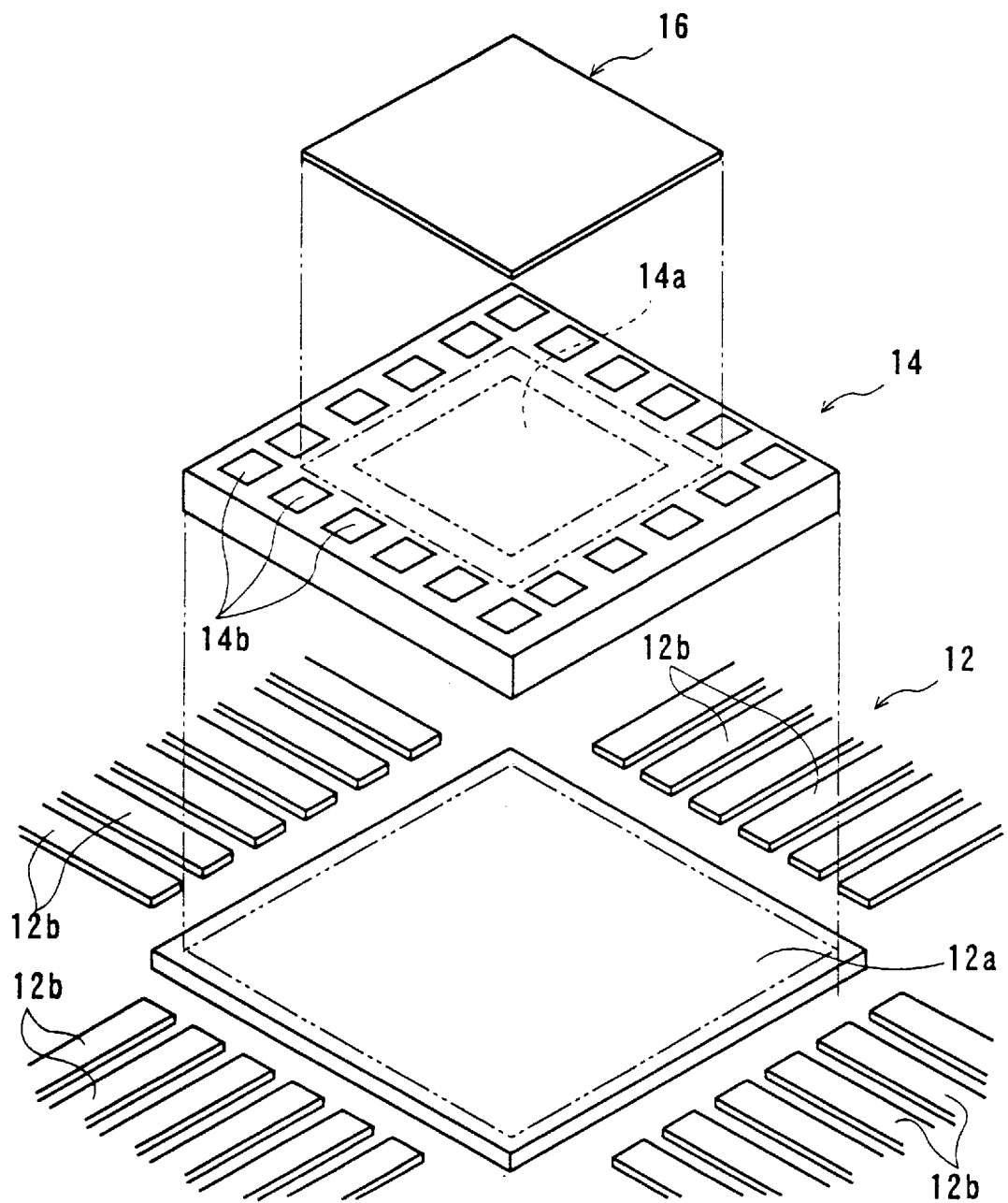
FIG. 1 is an exploded perspective view showing an essential part according to one embodiment of the present invention.
Figure 2:
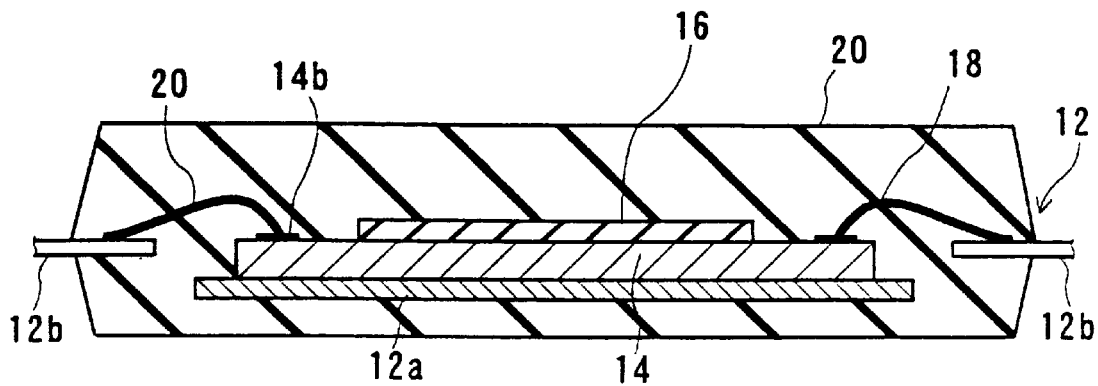
FIG. 2 is a sectional illustrative view of the FIG. 1 embodiment.

A semiconductor device 10 according to an embodiment of this invention, shown in FIG. 1 and FIG. 2, includes a lead-frame 12. The lead-frame 12 has a chip mounting base 12a in a rectangular form arranged at a center of the lead-frame 12. The lead-frame 12 is provided with a plurality of lead terminals 12b such that they extend outward from each of four side of the mounting base 12a. The mounting base 12a is mounted with an IC chip 14 on a surface thereof.

The IC chip 14 is formed with a plurality of circuit elements 14a, such as active elements and passive elements, at a surface center thereof. The area, in which these circuit elements 14a are formed, is referred to as "an element-forming area" for convenience sake. A plurality of electrode pads 14b are formed at locations surrounding the circuit elements 14a, which are respectively wire-bonded to the lead terminals 12b. The electrode pads 14c and the lead terminals 12b of the lead-frame 12 are wire-bonded therebetween through thin metal wires, as shown in FIG. 2, thus providing electrical connection. Further, a synthetic resin package 20 is transfer-molded to encapsulate an entire assembly in a state that the semiconductor chip 14 at its top surface is adhered with a flexible film 16.

Specifically, the flexible film 14 is adhered onto the top surface of the semiconductor chip 14 in a process prior to or after the metal-wire 18 bonding. The semiconductor chip 14 with the metal wires 18 is placed in a hermetic state within a cavity (not shown) defined by a pair of upper and lower metal molds (not shown) with the lead-frame 12 clamped between the metal molds. In this state, a molten synthetic resin is injected into this cavity, and cooled for cure. Thereafter, the lead terminals 12b are cut off from the lead-frame 12. The lead terminals 12b thus cut are bent into a form nearly flush with a backside of a package 20, thus completing a semiconductor device 10.

Note that the synthetic resin used for forming the package 20 is a thermosetting resin represented by an epoxy resin. The thermosetting resin is mixed with filler particles, typically of silica particles or the like.

It should be noted, in the embodiment of FIG. 1 and FIG. 2, that the flexible film 16 is of a size to cover at least the element-forming area on the semiconductor chip 14, which is adhered onto the top surface of the semiconductor chip 14 so as to be interposed between the semiconductor chip 14 and the package 20. The insertion of the flexible film 16 enables to relax the conventionally-problematic stresses acting on the package 20 and/or the semiconductor chip due to the elastic deformation of the flexible film 16. This prevents the package 20 and/or the semiconductor chip 14 from suffering the damages. The presence of the flexible film 16 also prevents the filler particles mixed in the synthetic resin for the package 20 from directly forced in the circuit element 14a on the semiconductor chip 14. Thus, the circuit elements 14a of the semiconductor chip 14 are positively prevented against being damaged.

The material of the flexible film 16 may employ a heat resistant resin, e.g., silicone resin, epoxy resin, natural-rubber based resin or a combination thereof. These materials are selectively adopted appropriately depending upon a required hardness. However, the flexible film uses a film having a modulus of elasticity in a range of from 1 kg/mm$^2$ to 500 kg/mm$^2$.

Whether to mix a particulate matter (not shown) in the flexible film 16, that is, whether there is a necessity of using a higher flexible film 16, may be determined according to a degree of damage to the package 22 and/or the semiconductor chip 14. That is, where there are greater stresses acting on the package 20 and/or the semiconductor chip 14, the flexible film 16 requires a greater amount of elastic deformation to relax the stress to a sufficient extent. In such a case, therefore, a particulate matter may be mixed in the flexible film 16 in order to positively reduce damages to the circuit element 14a caused by the filler particles contained in the package 20.

If the flexible film is excessively flexible in order to secure a sufficiently large amount of elastic deformation, there arises a lower of effect to prevent the circuit element from being damaged due to caving-in of filler particles. Where a particulate matter is mixed in the flexible film, if the filler particles of the package are forced in the flexible film, the elastic deformation in the flexible film causes the particulate matters present in the neighborhood to move in a closely related manner. This effectively blocks the filler particles from further caving in the flexible film. Therefore, the mixing of the particulate matter in the flexible film enables to satisfy contradictory requirements, i.e., releasing the stress and blocking the filler particles from caving in the circuit element.

The material of the particulate matter may utilize plastic, copper, etc. in order to obtain the effect by the particulate matter (not shown) as above. The particle diameter and mixing ratio of the particulate matter may be appropriately determined in relation to the size of the filler particles being used. The particle diameter of the particulate matter is at 1 to 20 μm as one example. This is because if the particle diameter is smaller than 1 μm, the resulting flexible film is less blockable against the filler particle, while if greater than 20 μm, the resulting flexible film 16 decreases in elasticity. The mixing ratio of the particulate matter, though not specified, may be appropriately determined depending upon the blockability against the filler particles.

Figure 3:
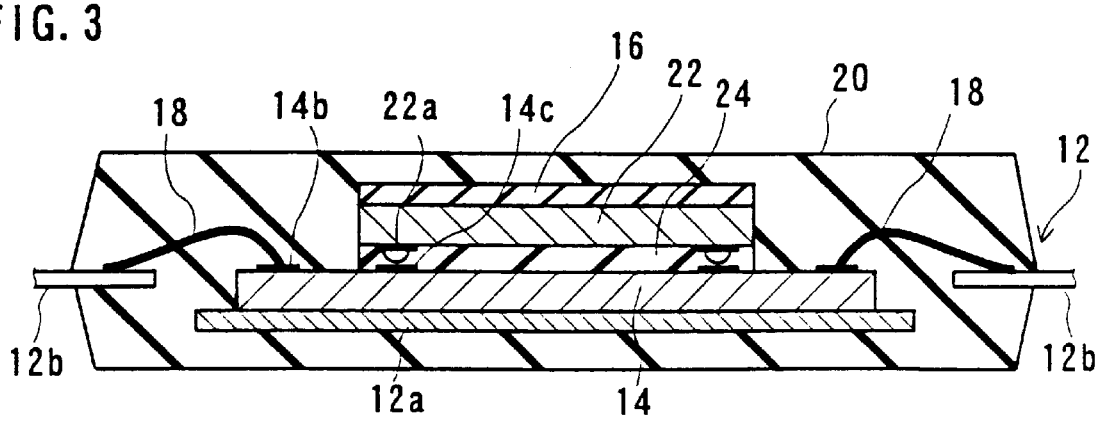
FIG. 3 is a sectional illustrative view showing another embodiment of this invention.

A semiconductor device 10 according to another embodiment, as shown in FIG. 3, is similar to the above-stated embodiment, except for the points below. That is, this embodiment has two semiconductor chips 14 and 22 in a stacked form, wherein the IC chip 14 is formed at a surface center with circuit elements 14a as demonstrated in the aforesaid embodiment. Surrounding the circuit elements 14a, a plurality of electrode pads 14c are formed for connection with the sub-chip 22. A plurality of bonding pads 14b are further formed in areas surrounding the electrode pads 14c.

On the IC chip 14 is placed the sub-chip 22 in a face-to-face relationship. This sub-chip 22 also has a plurality of circuit elements on a surface thereof, similarly to the IC chip 14. At an area surrounding the circuit elements, a plurality of bumps 22a are formed for connection to the electrode pads 14c provided on the IC chip 14. An anisotropic conductive sheet 24 is interposed between the IC chip 14 and the sub-chip 22. The anisotropic conductive sheet 24 is formed by mixing conductive particles in an adhesive resin. When the bump 22a is forcibly depressed onto the electrode pad 14c, the conductive particles existing therebetween are brought into mutual contact to thereby present electrical conductivity only in a thickness direction of the anisotropic conductive sheet 24.

In this embodiment, a flexible film 16 (a flexible film unmixed with a particulate matter or a flexible film mixed with a particulate matter) is interposed between the sub-chip 22 and the package 20. The insertion of the flexible film 16 at this position serves to release the stresses caused due to transfer-molding of a package 20, thus preventing the package 20 and/or semiconductor chip 22 (and semiconductor chip 14) from being damaged.

Further, in this embodiment, where an external force is applied to the IC chip 16 in a direction of closing together the IC chip 14 and the IC chip 16, the pressure on the IC chip 22 is relieved by the flexible film 16. Therefore, the sub-chip 16 is suppressed from warping to a minimum degree.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor chip having a circuit element;

a package formed of a synthetic resin with filler particles to encapsulate said semiconductor chip; and a flexible film interposed between and in contact with said semiconductor chip and said package to prevent said filler particles from directly contacting said circuit element on said semiconductor chip, said flexible film being mixed with a particulate matter, and said flexible film having a modulus of elasticity in a range from 1 kg/mm$^2$ to 500 kg/mm$^2$.

2. A semiconductor device according to claim 1, wherein said semiconductor chip includes an element-forming area having circuit elements formed therein, said flexible film having an area covering at least the element-forming area.

3. A semiconductor device according to claim 1, wherein said semiconductor chip includes a first semiconductor chip and a second semiconductor chip stacked and electrically coupled on said first semiconductor chip via an anisotropic conductive sheet and a plurality of bumps, said flexible film being interposed between said second semiconductor chip and said package.

4. A semiconductor device according to claim 1, wherein said flexible film is formed of at least one material selected from a group consisting of a silicone resin, an epoxy based resin and a natural rubber based resin.

5. A semiconductor device according to claim 1, wherein said particulate matter is formed of plastic or copper.

6. A semiconductor device according to claim 1, wherein said particulate matter has a particle diameter in a range of from 1 to 20 $\mu$m.

7. A semiconductor device according to claim 1, wherein said semiconductor chip includes a surface having an element-forming area formed with circuit elements and electrode pads formed around and on an outer peripheral side of said element-forming area, said flexible film being provided on said surface of said semiconductor chip at an area other than an area having said electrode pads.

* * * * *